United States Patent
Hsu et al.

(10) Patent No.: US 8,691,659 B2
(45) Date of Patent: Apr. 8, 2014

(54) METHOD FOR FORMING VOID-FREE DIELECTRIC LAYER

(75) Inventors: Ching-Pin Hsu, Tainan (TW); Yi-Po Lin, Tainan (TW); Jiunn-Hsiung Liao, Tainan (TW); Chieh-Te Chen, Kaohsiung (TW); Feng-Yi Chang, Chiayi County (TW); Shang-Yuan Tsai, Kaohsiung (TW); Li-Chiang Chen, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 198 days.

(21) Appl. No.: 13/281,459

(22) Filed: Oct. 26, 2011

(65) Prior Publication Data
US 2013/0109151 A1     May 2, 2013

(51) Int. Cl.
*H01L 21/762* (2006.01)

(52) U.S. Cl.
USPC .... 438/424; 257/343; 257/351; 257/E21.546; 438/437; 438/154; 438/786; 438/157; 438/694

(58) Field of Classification Search
USPC .......... 257/343, E21.546, 351; 438/424, 437, 438/154, 786, 157, 694
See application file for complete search history.

(56) References Cited

U.S. PATENT DOCUMENTS

| | | | |
|---|---|---|---|
| 4,478,655 A * | 10/1984 | Nagakubo et al. | 438/151 |
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,447,884 A | 9/1995 | Fahey | |
| 5,625,217 A | 4/1997 | Chau | |
| 5,691,215 A * | 11/1997 | Dai et al. | 438/305 |
| 5,777,364 A | 7/1998 | Crabbe | |
| 5,783,478 A | 7/1998 | Chau | |
| 5,783,479 A | 7/1998 | Lin | |
| 5,877,032 A * | 3/1999 | Guinn et al. | 438/9 |
| 5,960,322 A | 9/1999 | Xiang | |
| 6,008,109 A * | 12/1999 | Fulford et al. | 438/437 |
| 6,030,874 A | 2/2000 | Grider | |
| 6,037,237 A * | 3/2000 | Park et al. | 438/424 |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |

(Continued)

*Primary Examiner* — Lex Malsawma
*Assistant Examiner* — Sheng Zhu
(74) *Attorney, Agent, or Firm* — Winston Hsu; Scott Margo (57) ABSTRACT

A method for forming a dielectric layer free of voids is disclosed. First, a substrate, a first stressed layer including a recess, a second stressed layer disposed on the first stressed layer and covering the recess and a patterned photoresist embedded in the recess are provided. Second, a first etching step is performed to totally remove the photoresist so that the remaining second stressed layer forms at least one protrusion adjacent to the recess. Then, a trimming photoresist is formed without exposure to fill the recess and to cover the protrusion. Later, a trimming etching step is performed to eliminate the protrusion and to collaterally remove the trimming photoresist.

20 Claims, 8 Drawing Sheets

(56) References Cited

U.S. PATENT DOCUMENTS

| | | |
|---|---|---|
| 6,245,626 B1 | 6/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,652,718 B1 | 11/2003 | D'Couto |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,821,913 B2* | 11/2004 | Chuang et al. ............ 438/786 |
| 6,855,582 B1* | 2/2005 | Dakshina-Murthy et al. ............ 438/157 |
| 6,858,506 B2 | 2/2005 | Chang |
| 6,861,318 B2 | 3/2005 | Murthy |
| 6,864,135 B2 | 3/2005 | Grudowski |
| 6,864,164 B1* | 3/2005 | Dakshina-Murthy et al. ............ 438/585 |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,118,987 B2 | 10/2006 | Fu |
| 7,119,404 B2 | 10/2006 | Chang |
| 7,132,338 B2 | 11/2006 | Samoilov |
| 7,138,323 B2 | 11/2006 | Kavalieros |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,271,464 B2 | 9/2007 | Trivedi |
| 7,288,822 B1 | 10/2007 | Ting |
| 7,303,999 B1 | 12/2007 | Sriraman |
| 7,314,793 B2 | 1/2008 | Frohberg |
| 7,335,959 B2 | 2/2008 | Curello |
| 7,396,728 B2 | 7/2008 | Varghese |
| 7,410,859 B1 | 8/2008 | Peidous |
| 7,456,067 B2 | 11/2008 | Ang |
| 7,462,239 B2 | 12/2008 | Brabant |
| 7,482,245 B1 | 1/2009 | Yu |
| 7,491,615 B2 | 2/2009 | Wu |
| 7,494,856 B2 | 2/2009 | Zhang |
| 7,494,858 B2 | 2/2009 | Bohr |
| 7,517,816 B2 | 4/2009 | Frohberg |
| 7,550,336 B2 | 6/2009 | Hsiao |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 8,460,981 B2* | 6/2013 | Ellis-Monaghan et al. .. 438/154 |
| 2002/0135071 A1 | 9/2002 | Kang |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0001095 A1 | 1/2006 | Doris |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0197161 A1 | 9/2006 | Takao |
| 2006/0220144 A1* | 10/2006 | Anezaki et al. ............. 257/374 |
| 2006/0228842 A1 | 10/2006 | Zhang |
| 2006/0231826 A1 | 10/2006 | Kohyama |
| 2006/0258126 A1 | 11/2006 | Shiono |
| 2006/0281245 A1 | 12/2006 | Okuno |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0096215 A1* | 5/2007 | Chidambarrao et al. ..... 257/368 |
| 2007/0128783 A1 | 6/2007 | Ting |
| 2007/0141852 A1 | 6/2007 | Stapelmann |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0064219 A1* | 3/2008 | Jung ............................ 438/703 |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0173947 A1 | 7/2008 | Hou |
| 2008/0220579 A1 | 9/2008 | Pal |
| 2008/0233722 A1 | 9/2008 | Liao |
| 2008/0233746 A1 | 9/2008 | Huang |
| 2008/0242020 A1 | 10/2008 | Chen |
| 2008/0274595 A1* | 11/2008 | Spencer et al. ............. 438/154 |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0159981 A1 | 6/2009 | Niimi |
| 2009/0166625 A1 | 7/2009 | Ting |
| 2009/0184402 A1 | 7/2009 | Chen |
| 2009/0186475 A1 | 7/2009 | Ting |
| 2009/0230439 A1 | 9/2009 | Wang |
| 2009/0246922 A1 | 10/2009 | Wu |
| 2009/0278170 A1 | 11/2009 | Yang |
| 2009/0289284 A1 | 11/2009 | Goh |
| 2009/0302348 A1 | 12/2009 | Adam |
| 2010/0001317 A1 | 1/2010 | Chen |
| 2010/0059823 A1 | 3/2010 | Chung |
| 2010/0093147 A1 | 4/2010 | Liao |
| 2010/0184359 A1 | 7/2010 | Park |

* cited by examiner

METHOD FOR FORMING VOID-FREE DIELECTRIC LAYER

BACKGROUND OF THE INVENTION

1. Field of the Invention

The present invention generally relates to a method for forming a dielectric layer on a substrate having a recess. In particular, the present invention is directed to a method for forming a dielectric layer free of voids on a substrate having a recess.

2. Description of the Prior Art

A metal-oxide-semiconductor field-effect transistor, MOSFET for short, is a widely used field-effect transistor. According to the polarity of its channel, the MOSFET is divided into the P-type and the N-Type, i.e. PMOS and NMOS. Functionally speaking, PMOS and NMOS each has different threshold voltages, which are determined by the difference of the work function of the gate and the channel material. This can be accomplished by two different metals as the gate materials.

In order to increase the carrier mobility in the channel region to meet different requirements of the PMOS and NMOS, some stress layers of different stresses are respectively formed adjacent to the gate channels of the PMOS and NMOS in order to apply a suitable stress, such as a tensile stress or a compressive stress to the gate channels. For example, a tensile stress is suitable for an NMOS gate channel and a compressive stress is suitable for a PMOS or a gate channel.

However, when a dielectric layer is formed at a border region where stress layers of different stresses are close to each other, voids are also likely to be collaterally formed nearby. These voids may potentially damage the quality and reliability of the dielectric layer.

SUMMARY OF THE INVENTION

The present invention proposes a method for forming a dielectric layer free of voids at a border region where stress layers of different stresses are close to each other. In particular, the present invention proposes a method for forming a dielectric layer free of voids at such a border region when there is a recess disposed in the border region.

The method of the present invention includes at least the following steps. First, a substrate, a recess disposed in the substrate, a buffer layer disposed on the substrate without covering the recess and at least one protrusion disposed on the substrate and adjacent to the recess are provided. Second, a trimming photoresist without exposure is formed to fill the recess and to cover the protrusion and the exposed buffer layer. Then, an etching-back step is carried out to partially remove the trimming photoresist to expose the at least one protrusion. Later, a trimming etching step is carried out to eliminate the protrusion. Next, an ashing step is carried out to eliminate the trimming photoresist. Afterwards, a dielectric layer is carried out to fill the recess and to cover the buffer layer.

In one embodiment of the present invention, the method further includes the formation of a shallow trench isolation disposed under the recess.

In another embodiment of the present invention, the method for forming a dielectric layer further includes the following steps. First, a first stressed layer disposed on the substrate is formed to define the recess. Second, a second stressed layer disposed on the buffer layer and covering the recess is formed. Then, a patterned photoresist covering and embedded in the recess is formed. Then, a first etching step is carried out to remove the second stressed layer disposed on the buffer layer and to expose the buffer layer so that the remaining second stressed layer forms at least one protrusion adjacent to the recess.

In another embodiment of the present invention, the method further includes the formation of a silicide layer disposed on the substrate.

In another embodiment of the present invention, the method further includes the formation of a mask layer disposed on the second stressed layer.

In another embodiment of the present invention, the first etching step partially removes the mask layer to form part of the protrusion.

In another embodiment of the present invention, the second stressed layer is a compressive layer or a tensile layer different from the first stressed layer.

In another embodiment of the present invention, the trimming photoresist is baked.

In another embodiment of the present invention, an oxygen-containing etchant is used in the etching-back step.

In another embodiment of the present invention, the protrusion is not substantially damaged in the etching-back step.

In another embodiment of the present invention, a fluorine-containing etchant is used in the trimming etching step to remove at least one of a nitride and an oxide.

In another embodiment of the present invention, the etching-back step is monitored by a time mode.

In another embodiment of the present invention, the ashing step is carried out in an oxygen-containing atmosphere.

In another embodiment of the present invention, the remaining second stressed layer forms a pair of the protrusions adjacent to the recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
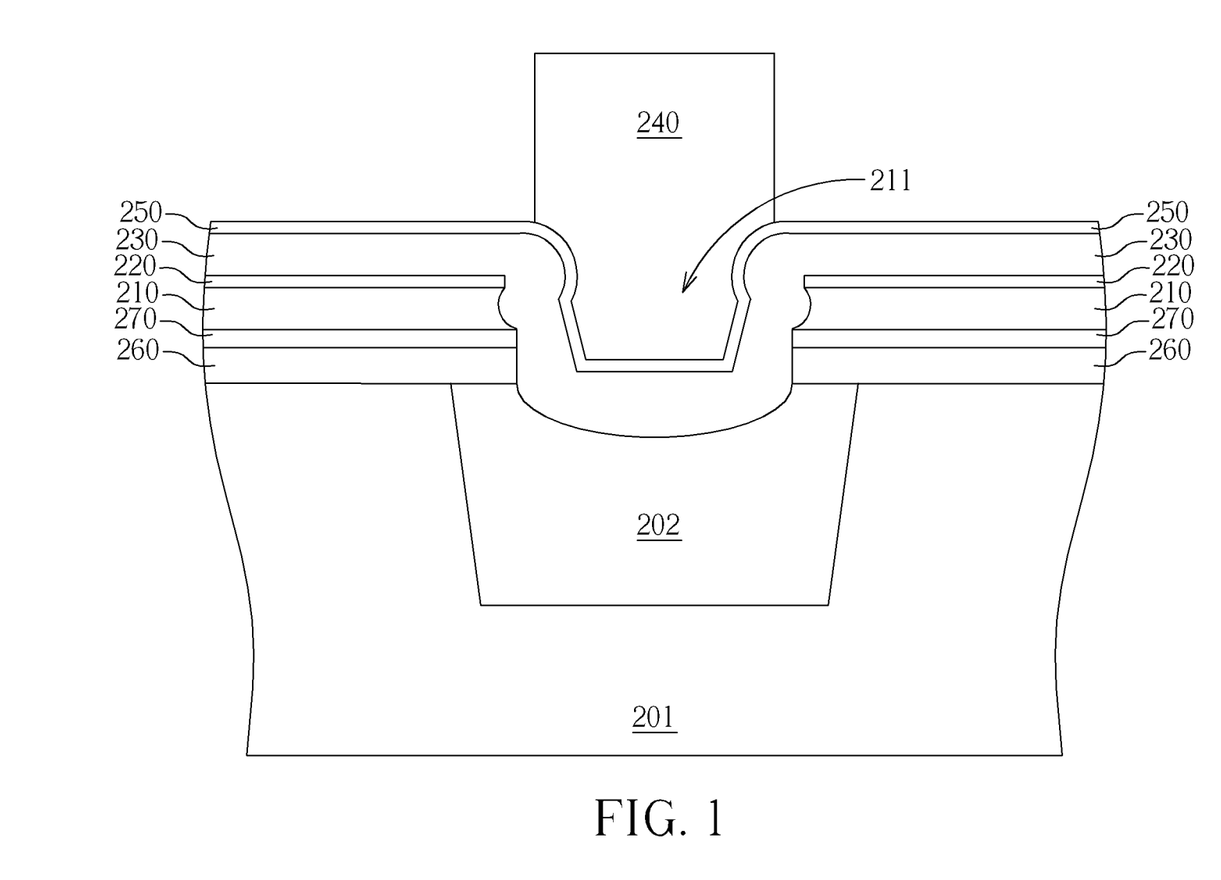
FIGS. 1-8 illustrate an example of the method for forming a dielectric layer free of voids of the present invention.

FIGS. 1-8 illustrate an example of the method for forming a dielectric layer free of voids of the present invention. First, as shown in FIG. 1, a substrate 201, a first stress layer 210, a recess 211, a buffer layer 220, a second stress layer 230 and a patterned photoresist 240 are provided. The substrate 201 may include poly-Si layer and a shallow trench isolation 202 which is formed in the substrate 201. The recess 211 is disposed in the substrate 201. The poly-Si layer may surround the recess 211 and be disposed under the buffer layer 220.

The shallow trench isolation 202 may be formed as follows. First a hard mask (not shown) is used to form a trench (not shown) by etching for defining the shallow trench isolation 202 in the substrate 201. The hard mask may be a single film or a composite film including materials such as nitride or oxide. Next, an insulating material, such as an oxide, is used to fill the trench (not shown) to obtain the shallow trench isolation 202. Usually, the hard mask (not shown) is removed after the excess insulating material is planarized by a chemical mechanical polishing procedure.

The first stressed layer 210 is disposed on the substrate 201 and defines a recess 211 on the substrate 201 above the shallow trench isolation 202. The first stressed layer 210 may have either a tensile stress or a compressive stress for use in an NMOS region (not shown) or in a PMOS region (not shown). The first stressed layer 210 may include a stressed nitride and be formed as described earlier. The recess 211 is defined by two adjacent first stressed layers 210 and disposed above the shallow trench isolation 202 in a border region where the first stressed layer 210 and the second stressed layer 230 meet each other.

The buffer layer 220 is disposed on the first stressed layer 210 and covers the first stressed layer 210. Like the first stressed layers 210, the recess 211 is also defined by two adjacent buffer layers 220 so the buffer layers 220 do not cover the recess 211. The buffer layer 220 may include an insulating material, such as an oxide, other than those of the first stressed layer 210 and the second stressed layer 230.

The second stressed layer 230 is disposed on the buffer layer 220. As shown in FIG. 1, the second stressed layer 230 not only covers the first stressed layer 210 and the buffer layer 220, but also covers the recess 211 as well. Like the first stressed layers 210, the second stressed layer 230 is also a compressive layer or a tensile layer. Preferably, the second stressed layer 230 is a stressed layer with a stress opposite to a stress of the first stressed layer 210. For example, if the first stressed layer 210 is a compressive layer, the second stressed layer 230 is a tensile layer. Otherwise, supposing the first stressed layer 210 is a tensile layer, the second stressed layer 230 is a compressive layer.

The patterned photoresist 240 is formed on the second stressed layer 230. In particular, the patterned photoresist 240 fills up the recess 211 and is embedded in the recess 211 to protect a region where there is only the second stressed layer 230 without the first stressed layer 210, as shown in FIG. 1.

Accordingly, the patterned photoresist 240 underwent some procedures to have a pre-determined pattern. For example, the patterned photoresist 240 underwent some lithographic procedures, such as a baking procedure to harden the material of the photoresist and an exposure procedure, to define the pre-determined pattern.

Optionally, there may be a mask layer 250 formed on the second stressed layer 230, disposed in the recess 211 and under the patterned photoresist 240. The mask layer 250 may include an insulating material, such as an oxide, other than these of the first stressed layer 210 and the second stressed layer 230.

Further, there may be some additional layers disposed on the substrate 201. For example, the substrate 201 may include a poly-Si layer 260, and surrounds the recess 211. Or, there may be a silicide layer 270 formed on the poly-Si layer 260 and surrounding the recess 211 together with the poly-Si layer 260 by reacting a metal (not shown) with the poly-Si layer 260 in a thermal procedure.

Figure 2:
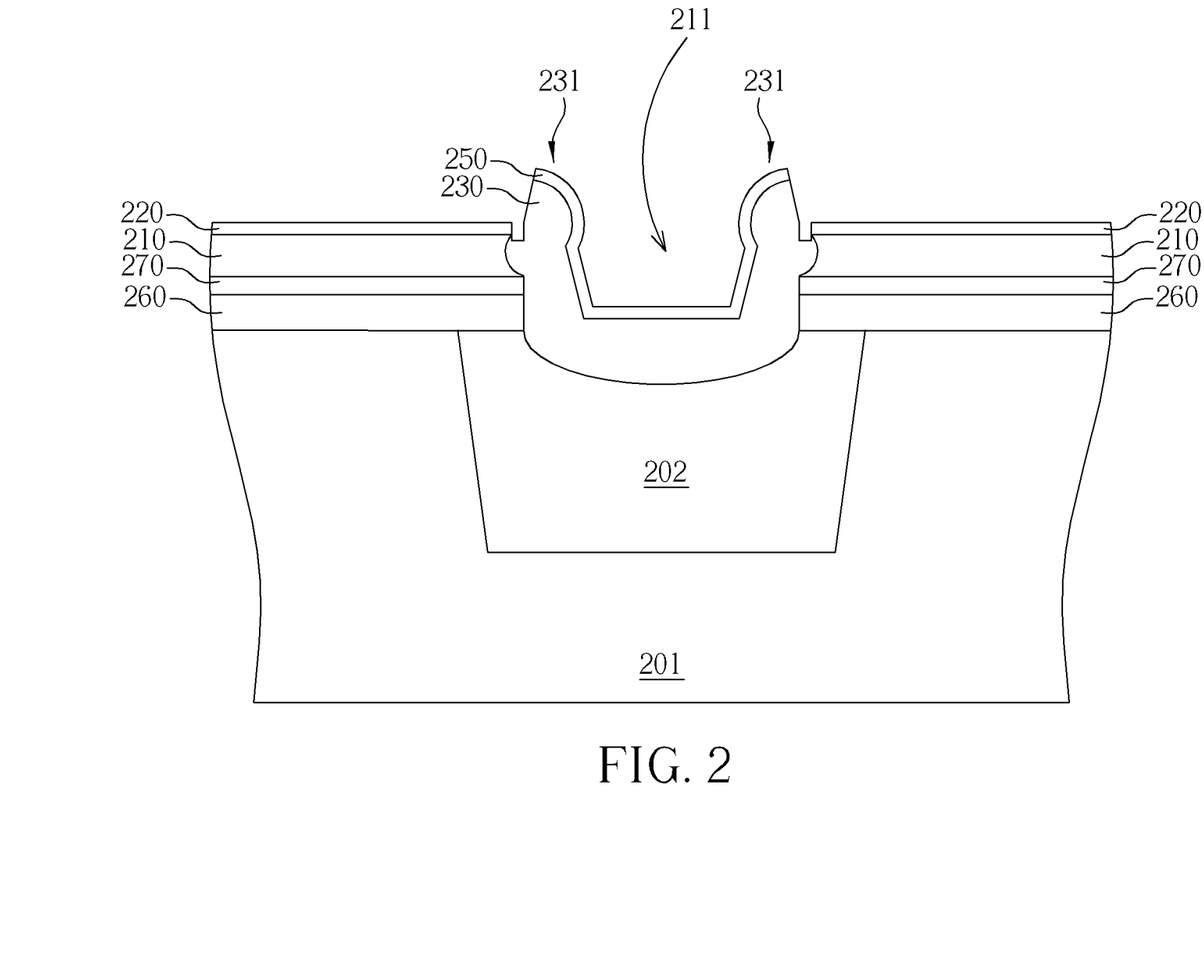

Second, as shown in FIG. 2, a first etching step is carried out to remove the excess second stressed layer 230 and some of the mask layer 250 disposed on the buffer layer 220. The buffer layer 220 may serve as an etching-stop layer in the first etching step. After the first etching step, some of the second stressed layer 230 and the mask layer 250 remain in the recess 211. The first etching step may collaterally remove the photoresist 240 or the remaining photoresist 240 is removed in an additional step.

In such a way, the first etching step exposes the underlying buffer layer 220. Because of the protection of the photoresist 240, some of the second stressed layer 230 and the mask layer 250 are not removed so the remaining second stressed layer 230 and the optional mask layer 250 format least one protrusion 231 adjacent to the recess 211, and possibly form a pair of protrusions 231 adjacent to the recess 211.

Figure 3:
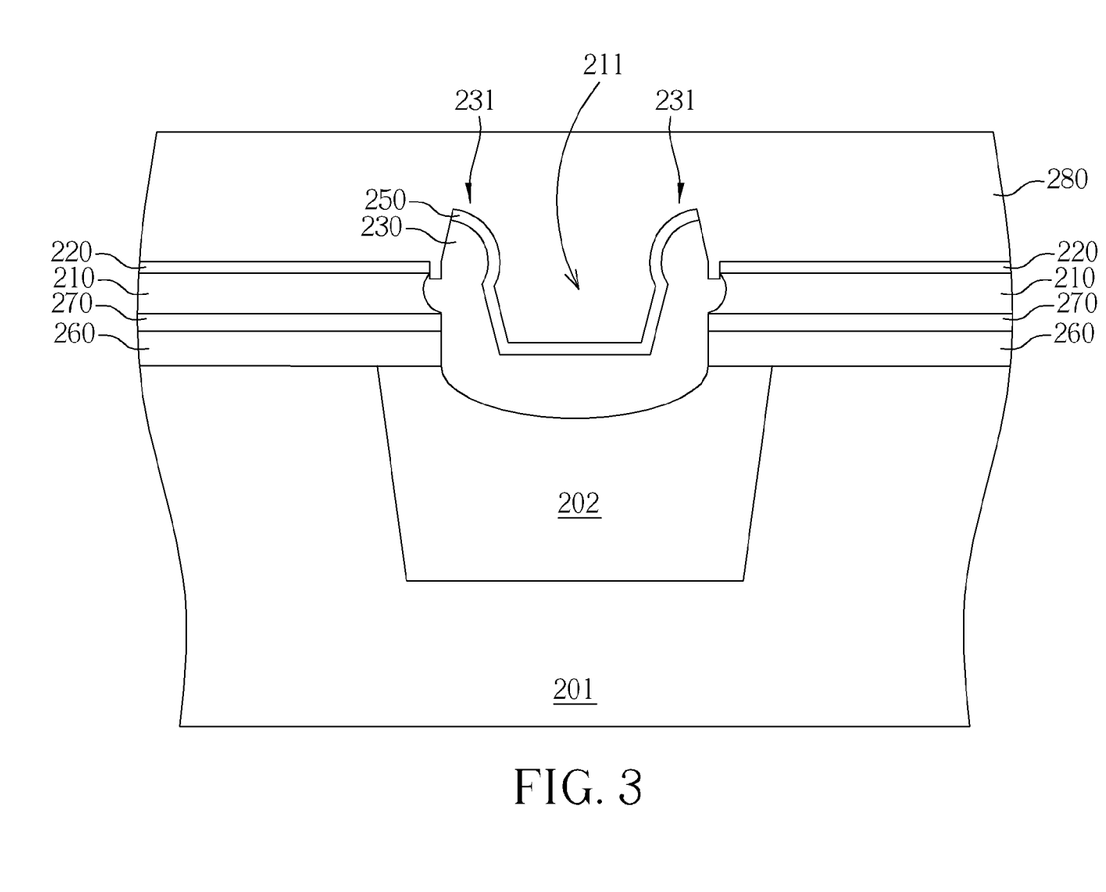

Then, as shown in FIG. 3, a trimming photoresist 280 is formed to cover all of the protrusion 231. The trimming photoresist 280 helps to remove the protrusion 231 in a later step. When the trimming photoresist 280 covers all of the protrusion 231, it also fills the recess 211 and the exposed buffer layer 220 at the same time. The trimming photoresist 280 is just like any other usual photoresist. For example, the trimming photoresist 280 and the above patterned photoresist 240 may contain the same material. Or, the trimming photoresist 280 and the above patterned photoresist 240 may contain different materials.

Please note that the trimming photoresist 280 may undergo a baking procedure. However, one feature of the present invention resides in that the trimming photoresist 280 does not have to undergo an exposure procedure like the above patterned photoresist 240 did. So, unlike the above patterned photoresist 240, the trimming photoresist 280 does not have a pre-determined pattern.

Figure 4:
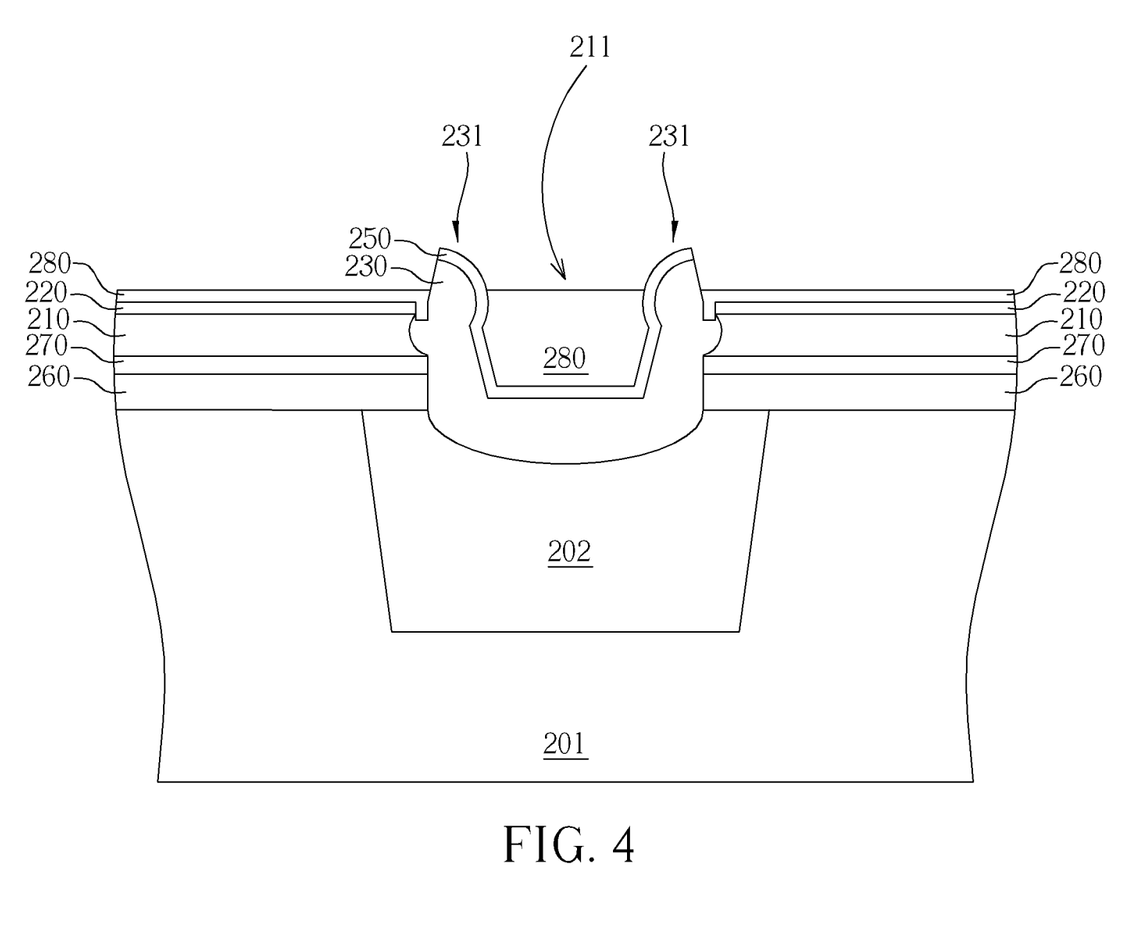

Next, as shown in FIG. 4, an etching-back step is carried out, such as by plasma, to remove most of but not all of the trimming photoresist 280. Since not all of the trimming photoresist 280 is removed in the etching-back step, only every protrusion 231 but not the underlying buffer layer 220 is exposed after the etching-back step is done. Preferably, the trimming photoresist 280 within the recess 211 is not removed after the etching-back step is done.

Depending on the materials contained in the trimming photoresist 280, the etching-back step may use an etchant to selectively etch the trimming photoresist 280 without substantially damaging the protrusion 231. For example, if the trimming photoresist 280 contains an organic material and the protrusion 231 includes an oxide and/or a nitride, the etching-back step may use an oxygen-containing etchant. Also, since there is no obvious end to the etching in this etching stage (because there is still some remaining trimming photoresist 280 when the etching-back step is finished), the etching-back step may be monitored by a time mode or by an empirical way.

Figure 5:
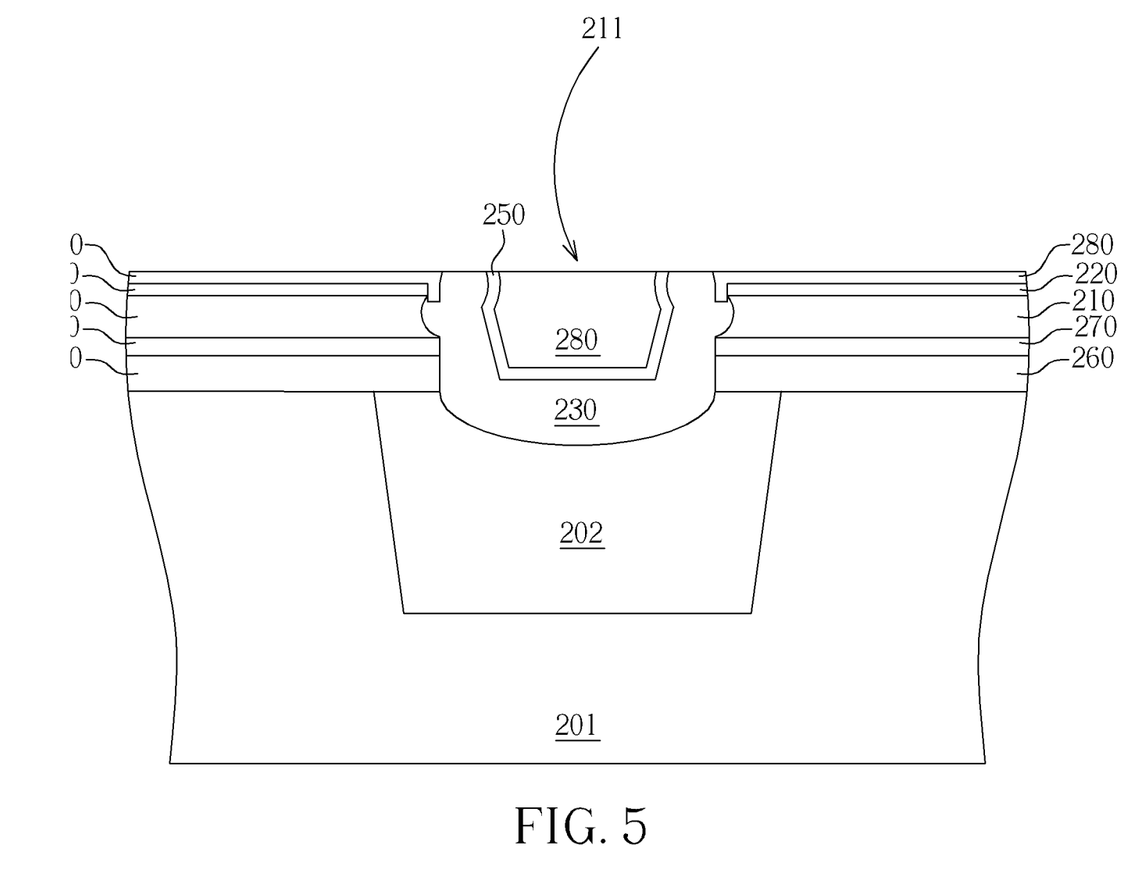

After that, as shown in FIG. 5, a trimming etching step is carried out, such as by plasma, to trim off the protrusions 231 above the surface of the buffer layer 220. In other words, the trimming etching step is used to eliminate the protrusions 231 with the help of and in the presence of the trimming photoresist 280. There may be some remaining trimming photoresist 280 disposed on the buffer layer 220 to protect the underlying buffer layer 220 after the trimming etching step is done. Please also note that the trimming photoresist 280 within the recess 211 is not entirely removed in the trimming etching step.

Figure 6:
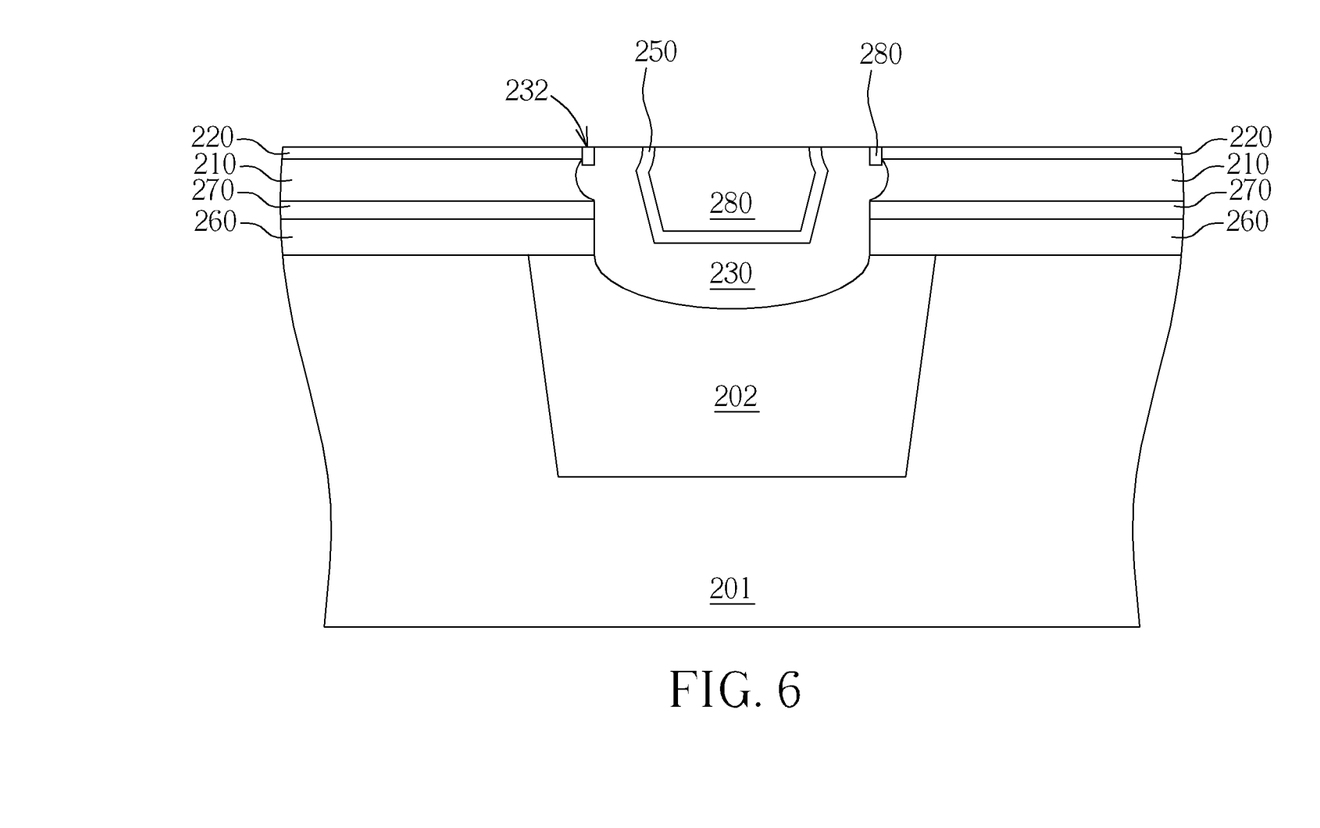

However, in a preferred embodiment of the present invention, as shown in FIG. 6, a trimming etching step is carried out, such as by plasma, to trim off the protrusions 231 above the surface of the buffer layer 220 with the help of and in the presence of the trimming photoresist 280, and simultaneously collaterally removes the remaining trimming photoresist 280 disposed on the buffer layer 220 so the underlying buffer layer 220 is exposed after the trimming etching step is done. Please also note that the trimming photoresist 280 within the recess 211 is not entirely removed in the trimming etching step. Also, as shown in FIG. 6, it is possible that there may be some trimming photoresist 280 remaining in the notch 232 between the second stressed layer 230 and the buffer layer 220.

Depending on the materials made of the protrusion 231, the trimming etching step may use an etchant to mainly etch the protrusion 231. For example, if the trimming photoresist 280 contains an organic material and the protrusion 231 includes an oxide and/or a nitride, the trimming etching step may use a fluorine-containing etchant to selectively etch the oxide and/or the nitride.

Figure 7:
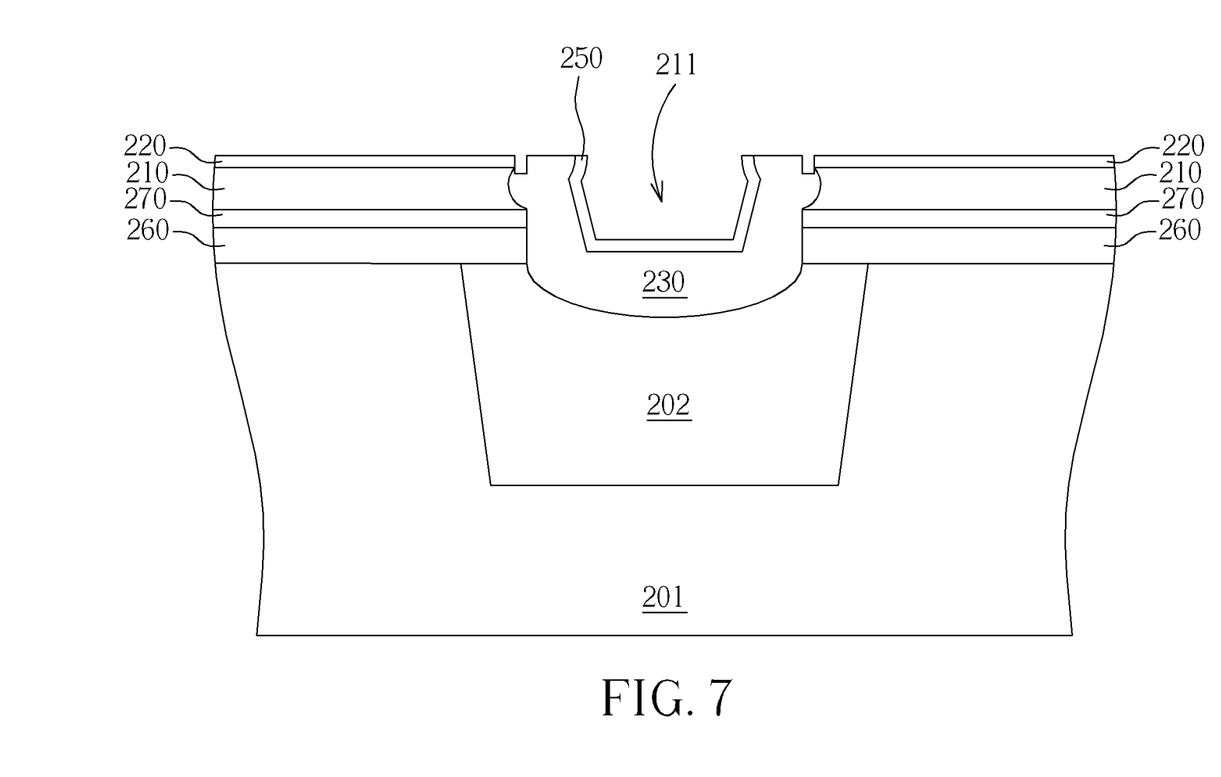

As shown in FIG. 7, after the trimming etching step, an ashing step is carried out to eliminate the remaining trimming photoresist 280 left on the buffer layer 220 and in the recess 211, and notch 232. The ashing step may be carried out in an oxygen-containing atmosphere.

Figure 8:
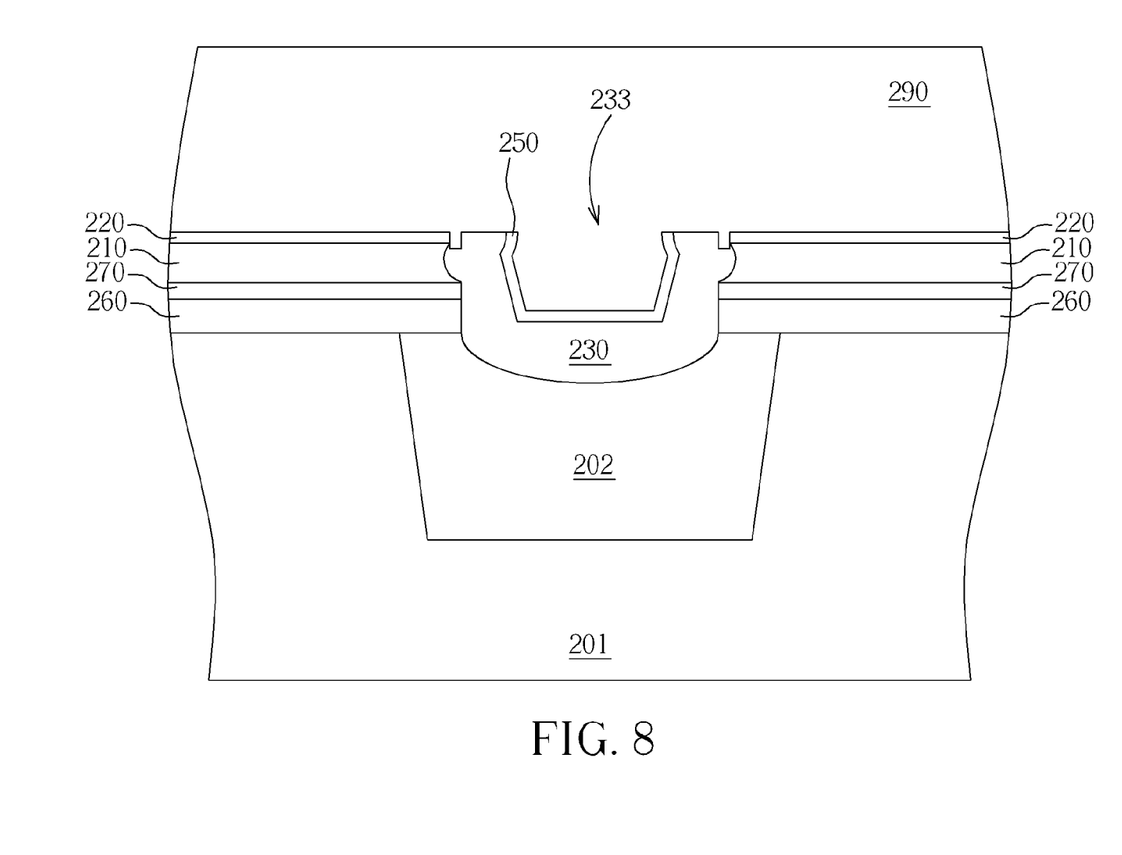

Afterwards, as shown in FIG. 8, an insulating material is used to cover the buffer layer 220 as well as to fill the recess 211 to form a dielectric layer 290. If any of the protrusions 231 were present when the insulating material would be used to cover the buffer layer 220 and the recess 211, a void (not shown) is highly likely to be formed between the protrusions 231 within the opening 233 of the recess 211 due to a much narrower opening 233. However, since the protrusions 231 are removed in the above step, there is no obstacle to encourage the formation of the void so the resultant dielectric layer 290 is absolutely void-free. Consequently, the problem of a possible defective dielectric layer with voids existing near the border region where the stress layers of different stresses are close to each other can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a dielectric layer, comprising:
   providing a substrate, a recess disposed in said substrate, a buffer layer disposed on said substrate without covering said recess and at least one protrusion disposed on said substrate and adjacent to said recess;
   forming a trimming photoresist without exposure to fill said recess and to cover said protrusion and said exposed buffer layer;
   performing an etching-back step to partially remove said trimming photoresist to expose said at least one protrusion;
   performing a trimming etching step to eliminate said protrusion;
   performing an ashing step to eliminate said trimming photoresist; and
   forming a dielectric layer to fill said recess and to cover said buffer layer.

2. The method for forming a dielectric layer of claim 1, further comprising:
   forming a shallow trench isolation disposed under said recess.

3. The method for forming a dielectric layer of claim 1, wherein said substrate comprises a polysilicon layer surrounding said recess and under said buffer layer.

4. The method for forming a dielectric layer of claim 1, further comprising:
   forming a silicide layer disposed on said substrate.

5. The method for forming a dielectric layer of claim 1, further comprising:
   forming a first stressed layer disposed on said substrate to define said recess;
   forming a second stressed layer disposed on said buffer layer and covering said recess;
   forming a patterned photoresist covering and embedded in said recess; and
   performing a first etching step to remove said second stressed layer disposed on said buffer layer and to expose said buffer layer so that said remaining second stressed layer forms at least one protrusion adjacent to said recess.

6. The method for forming a dielectric layer of claim 5, further comprising:
   forming a mask layer disposed on said second stressed layer.

7. The method for forming a dielectric layer of claim 6, wherein said first etching step partially removes said mask layer to form part of said protrusion.

8. The method for forming a dielectric layer of claim 5, wherein said first stressed layer is one of a compressive layer and a tensile layer.

9. The method for forming a dielectric layer of claim 5, wherein said second stressed layer is one of a compressive layer and a tensile layer different from said first stressed layer.

10. The method for forming a dielectric layer of claim 1, wherein said trimming photoresist is baked.

11. The method for forming a dielectric layer of claim 5, wherein said trimming photoresist and said patterned photoresist are of the same material.

12. The method for forming a dielectric layer of claim 5, wherein said trimming photoresist and said patterned photoresist are of different materials.

13. The method for forming a dielectric layer of claim 1, wherein an oxygen-containing etchant is used in said etching-back step.

14. The method for forming a dielectric layer of claim 1, wherein said protrusion is not substantially damaged in said etching-back step.

15. The method for forming a dielectric layer of claim 1, wherein said etching-back step is monitored by a time mode.

16. The method for forming a dielectric layer of claim 1, wherein a fluorine-containing etchant is used in said trimming etching step.

17. The method for forming a dielectric layer of claim 1, wherein said trimming etching step collaterally removes said trimming photoresist on said buffer layer to expose said buffer layer.

18. The method for forming a dielectric layer of claim 1, wherein said ashing step is performed in an oxygen-containing atmosphere.

19. The method for forming a dielectric layer of claim 5, wherein said remaining second stressed layer forms a pair of said protrusions adjacent to said recess.

20. The method for forming a dielectric layer of claim 1, wherein said dielectric layer is free of voids.

* * * * *